United States Patent
Das et al.

(10) Patent No.: US 9,972,388 B2
(45) Date of Patent: May 15, 2018

(54) METHOD, SYSTEM AND DEVICE FOR POWER-UP OPERATION

(71) Applicant: ARM Ltd., Cambridge (GB)

(72) Inventors: Shidhartha Das, Upper Cambourne (GB); Piyush Agarwal, Noida (IN); Akshay Kumar, New Delhi (IN); Azeez Jennudin Bhavnagarwala, Newtown, CT (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 15/291,627

(22) Filed: Oct. 12, 2016

(65) Prior Publication Data
US 2018/0102170 A1    Apr. 12, 2018

(51) Int. Cl.
G11C 13/00 (2006.01)

(52) U.S. Cl.
CPC ...... G11C 13/0069 (2013.01); G11C 13/0007 (2013.01); G11C 13/0028 (2013.01); G11C 13/0038 (2013.01); G11C 13/0097 (2013.01)

(58) Field of Classification Search
CPC ............ G11C 13/0069; G11C 13/0007; G11C 13/0038; G11C 13/0028; G11C 13/0097
USPC ........ 365/148, 158, 171, 173, 163; 257/421, 257/427
See application file for complete search history.

(56) References Cited

U.S. PATENT DOCUMENTS

| | | | | |
|---|---|---|---|---|
| 5,161,121 A | * | 11/1992 | Cho | G11C 11/4085 365/189.06 |
| 5,257,239 A | * | 10/1993 | Guo | G11C 7/20 365/189.05 |
| 5,400,294 A | * | 3/1995 | Srinivasan | G11C 7/20 365/189.05 |
| 5,539,279 A | * | 7/1996 | Takeuchi | G11C 11/22 365/145 |
| 5,576,988 A | * | 11/1996 | Kuo | H01L 27/02 257/316 |
| 6,201,731 B1 | * | 3/2001 | Kamp | G11C 11/22 365/145 |
| 6,483,357 B2 | * | 11/2002 | Kato | G05F 1/465 327/143 |
| 7,298,640 B2 | | 11/2007 | Chen et al. | |
| 7,414,876 B2 | * | 8/2008 | Kang | G11C 11/22 365/145 |
| 7,639,523 B2 | | 12/2009 | Celinska et al. | |
| 7,778,063 B2 | | 8/2010 | Brubaker et al. | |
| 7,872,900 B2 | | 1/2011 | Paz De Araujo et al. | |
| 9,558,819 B1 | | 1/2017 | Aitken et al. | |
| 9,584,118 B1 | | 2/2017 | Dao et al. | |
| 9,589,636 B1 | | 3/2017 | Bhavnagarwala et al. | |
| 9,627,615 B1 | | 4/2017 | Reid et al. | |
| 2008/0106926 A1 | | 5/2008 | Brubaker | |
| 2008/0107801 A1 | | 5/2008 | Celinska et al. | |
| 2013/0200323 A1 | | 8/2013 | Pham et al. | |

(Continued)

*Primary Examiner* — Vu Le
*Assistant Examiner* — Sung Cho
(74) *Attorney, Agent, or Firm* — Berkeley Law & Technology Group, LLP (57) ABSTRACT

Disclosed are methods, systems and devices for powering up devices including non-volatile memory elements in an array of non-volatile memory elements. In one aspect, during a sequence for powering up an integrated device, non-volatile memory elements may be isolated from voltage supplies to avoid in advertent changes of memory states stored in the non-volatile memory elements.

18 Claims, 5 Drawing Sheets

(56) References Cited

U.S. PATENT DOCUMENTS

| | | |
|---|---|---|
| 2013/0214232 A1 | 8/2013 | Tendulkar et al. |
| 2013/0285699 A1 | 10/2013 | McWilliams et al. |
| 2016/0049197 A1* | 2/2016 | Park .................. G11C 13/0069 365/148 |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |

* cited by examiner

METHOD, SYSTEM AND DEVICE FOR POWER-UP OPERATION

BACKGROUND

1. Field

Disclosed are techniques for powering up devices that include memory.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\varepsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may be best understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a = 0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In one aspect, a resistance of a CES in the second memory cell state may be more than 100 times the resistance in the second memory cell state. In a particular implementation, a CES device may switch resistive states responsive to a Mott-transition in a majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on detection of a signal in a "read operation." In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. A "programming signal" as referred to herein means a condition applied across terminals of a device to affect a physical state such as in a write operation. In one example implementation, a programming signal may comprise a current and a voltage applied across terminals of a device to place the device in a particular impedance state. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative)

than while the memory device in a second memory state referred to as a conductive or low impedance memory state.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 1A:
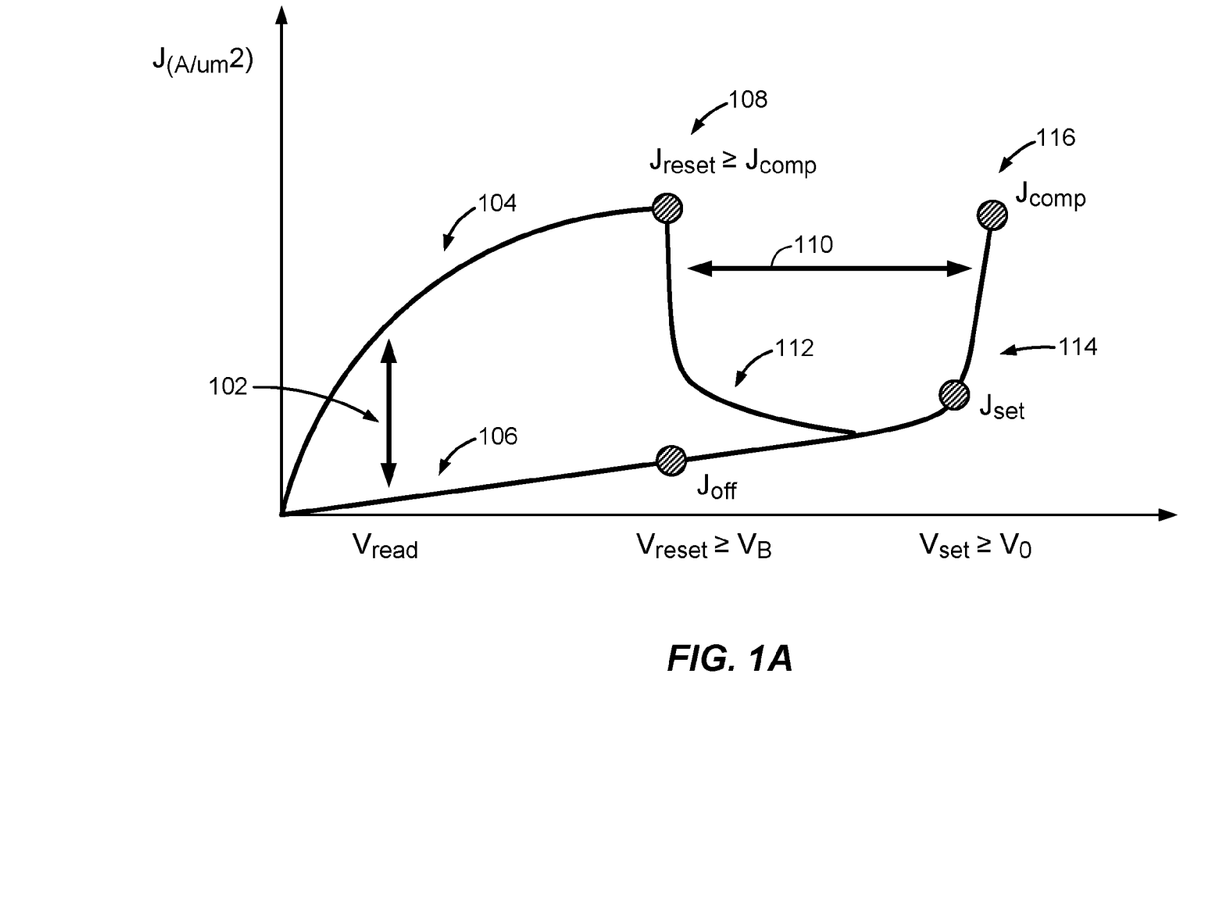
FIG. 1A shows a plot of current density versus voltage for a correlated electron switch (CES) device according to an embodiment.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a low impedance or conductive memory state and application of a voltage $V_{reset}$ and a current density $J_{reset}$ may place the CES device in a high impedance or insulative memory state. Following placement of the CES in an insulative state or conductive memory state, the particular state of the CES device may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, $\{M(chxn)_2Br\}Br_2$ where M may comprise Pt, Pd, or Ni, and chxn comprises 1R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable impedance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by $NiO(C_x)$. Here, one skilled in the art may determine a value of x for any specific carbon containing ligand and any specific combination of carbon containing ligand with NiO simply by balancing valences. In another particular example, NiO doped with extrinsic ligands may be expressed as $NiO(L_x)$, where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a set state, an increase in electrons may screen electrons and remove a localization of electrons, which may collapse the band-splitting potential forming a metal.

According to an embodiment, current in a CES device may be controlled by an externally applied "compliance" condition determined based, at least in part, on the external current limited during a write operation a write operation to place the CES device in an insulative state. This externally applied compliance current may also set a condition of a current density for a subsequent reset operation to place the CES in a conductive state. As shown in the particular implementation of FIG. 1A, a current density $J_{comp}$ applied during a write operation at point 116 to place the CES device in an insulative state may determine a compliance condition for placing the CES device in a conductive state in a subsequent write operation. As shown, the CES device may be subsequently placed in a conductive state by application of a current density $J_{reset} \geq J_{comp}$ at a voltage $V_{reset}$ at point 108, where $J_{comp}$ is externally applied.

The compliance condition therefore may determine a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \tag{1}$$

$$n = \left(\frac{C}{\lambda_{TF}}\right)^3$$

where:

$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$. and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CeRam}} = \frac{q}{A_{CeRam}t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{IM}(V_{IM}) = \frac{dQ(V_{IM})}{dt} \approx \frac{Q(V_{IM})}{t} \quad (4)$$

$$Q(V_{IM}) = qn(V_{IM})$$

$$I_{IM}(V_{IM}) = \frac{Q(V_{IM})}{t} = \frac{qn(V_{IM})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CeRam}} = \frac{q}{A_{CeRam}t}\left(\frac{C}{a_B}\right)^3$$

where:
AB is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined, at least in part, by materials and doping of the CES device.

Figure 1B:
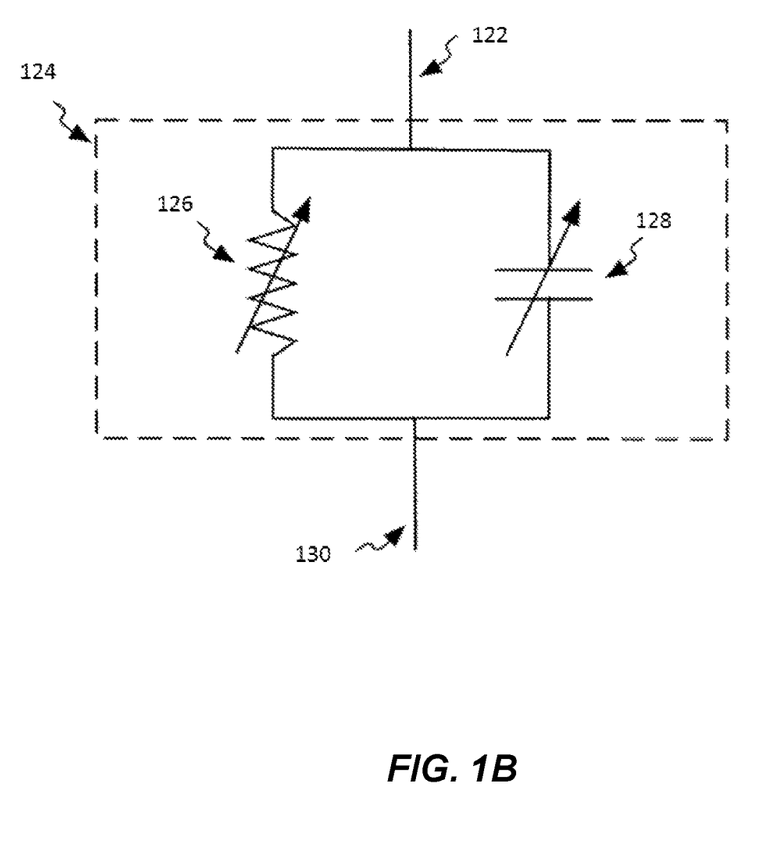
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogenous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

According to an embodiment, a CES element implemented in CeRAM and/or non-volatile memory enables read and write operations to occur at very low voltages. This is particularly advantageous where CeRAM is implemented in a system on a Chip (SoC) where small form factors and low power consumption is desired. However, given that CES elements may be configured to operate at very low programming or erase voltages, CES elements may be vulnerable to transients during power up operations, for example. For example, CES elements exposed to power transients during power up may be vulnerable to unintended write operations that change an impedance state of the exposed CES elements.

According to an embodiment, a signal on a wordline may be clamped so as to disconnect a terminal of at least one non-volatile memory element of an array of non-volatile memory elements of an integrated device in response to a start of a power up sequence for the integrated device. One or more voltage sources to generate a programming signal for a write operation on the at least one non-volatile memory element may be powered up while the wordline is being clamped. The wordline may then be unclamped following the powering of the one or more voltage sources.

Figure 2:
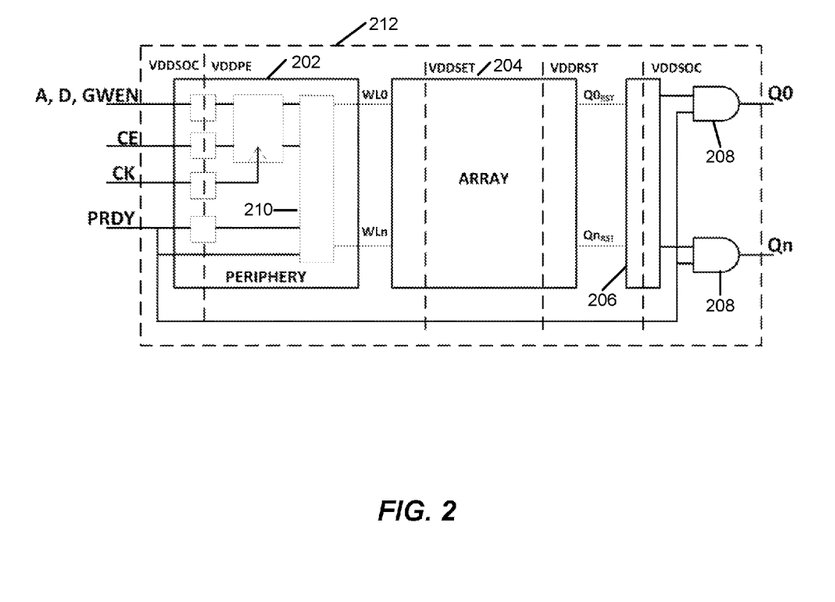
FIG. 2 is schematic diagram of a device that includes a memory array according to an embodiment.

FIG. 2 is schematic diagram of a device that includes periphery circuitry 202 and a memory array 204 in an integrated device according to an embodiment. An "integrated device" as referred to herein means a device comprising multiple components combined in a common package that may be combined with other devices to perform a function or task. In one implementation, an integrated device may comprise a single integrated circuit formed in a single wafer. In another implementation, an integrated device may comprise multiple integrated circuit devices combined in a single package that may be integrated with a larger system (e.g., mounted in a printed circuit board). It should be understood, however, that these are merely examples of an integrated device and claimed subject matter is not limited in this respect.

Periphery circuitry 202 may include, for example, processors, core logic, circuitry, etc. for performing one or more embedded functions or applications. In a particular implementation, periphery circuitry 202 and a memory array 204 may be integrated in a single integrated circuit device 212. Array 204 may comprise non-volatile memory cells capable of storing a state representing data, symbols, values or parameters that may be changed using write operations and/or retrieved using read operations. Array 204 may also store executable instructions such as firmware, etc. that may be executed by processors in periphery circuitry 202.

Periphery circuitry 202 may also comprise a memory controller 210 for use in accessing or selecting individual memory cells or associated groups of memory cells in array 204 for read and write operations. For example, memory controller 210 may comprise wordline driver circuits (not shown) for use in controlling voltages on wordlines WL0 through WLn. In this context, a "wordline" comprises a conductor for transmitting a signal to select a particular memory cell or group of associated memory cells, or a particular memory element or associated group of memory elements, to be accessed in a read operation or a write operation. In a particular example implementation, a voltage of a signal on a wordline may be raised or lowered to select or deselect a particular memory cell or associated group of memory cells, or a particular memory element or group of associated memory elements, to be connected to a corresponding bitline or group of bitlines, or a particular memory element or group of associated memory elements, during a read or write operation. It should be understood, however, that this is merely an example of a wordline and that claimed subject matter is not limited in this respect.

According to an embodiment, power to device in integrated circuit device 212 may originate from a single power source signal as signal VDDSOC. Other power source signals, such as signal VDDPE to provide a peripheral power signal to components in periphery 202 and array 204, may be derived from signal VDDSOC using internal level shifters. In this context, a "power source signal" as referred to herein means a signal that is maintained at a particular voltage and/or current for application to a circuit load. A "power source" as referred to herein related to circuitry in combination with an electrical energy source capable of generating a power source signal. Additional power source signals VDDSET and VDDRST may be derived from power source signal VDDSOC and/or power source signal VDDPE. Here, signal VDDSET may be used to generate a first programming signal to place a non-volatile memory element of array 204 in a low impedance or conductive state in a set operation while signal VDDRST may be used to generate a second programming signal to place a non-volatile memory element of array 204 in a high impedance or insulative state in a reset operation. Other voltage sources may include a power signal (not shown) for use in read operations to detect an impedance state of a memory element.

As pointed out above, in the particular implementation in which non-volatile memory elements in array 204 comprise CES elements, these CES elements may be vulnerable to unintended set or reset operations arising from transients during a power-up sequence. According to an embodiment, a signal PRDY provided at a signal pad of integrated circuit device 212 may be used to isolate CES elements during a power sequence until, for example, power sources such as signals VDDSET and VDDRST are fully powered. For example, responsive to signal PRDY voltages on wordlines WL0 through WLn may be clamped so as to prevent memory elements in array 204 from being connected to a power signal. For example, isolating CES elements of array 204 may protect the current impedance state of the isolated CES elements from transients during a power up sequence.

Figure 3:
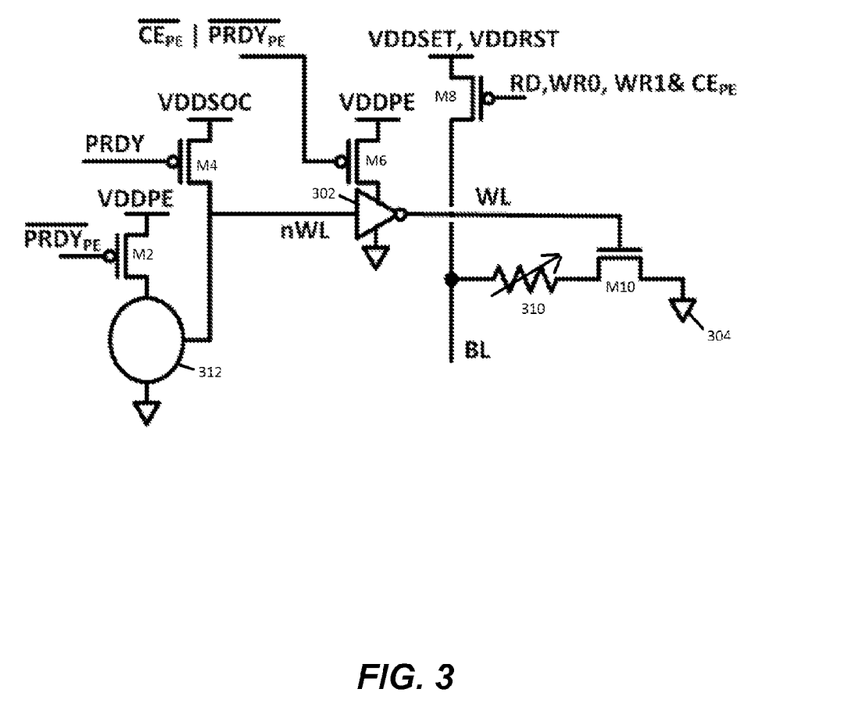
FIG. 3 is schematic diagram of a circuit for implementing a sequence for power-up a device according to an embodiment.

FIG. 3 is schematic diagram of a circuit for implementing a procedure for powering-up a device according to an embodiment. In this context, a "power-up procedure" as referred to herein means a procedure to change a state of one or more electrical or electronic components by applying power enabling some level of operation. For example, a power-up procedure may comprise a sequence of actions or steps to generate and/or distribute one or more power supply source signals in a device to one or more components. It should be understood, however, that this is merely an example of a power-up procedure, and that claimed subject matter is not limited in this respect. Here, non-volatile memory element 310 may represent a single non-volatile memory element in array 204 according to an embodiment. While only a single non-volatile memory element 310 is shown for simplicity of illustrating particular features, it should be understood that array 204 may include multiple like non-volatile memory elements, and that features illustrated and described herein may be replicated for corresponding additional non-volatile memory elements. Also, as discussed above, non-volatile memory element 310 may comprise a CES element that may operate at very low read and write voltages. Also, it should be understood that features discussed in connection with wordline WL shown in FIG. 3 may be applicable to one or more of wordlines WL0 through WLn shown in the implementation of FIG. 2.

According to an embodiment, power sources such as signal VDDSET and signal VDDRST may be coupled to bitline BL in operations such as a write operation or a read operation. While a first terminal of non-volatile memory element 310 is connected to bitline BL, a programming signal may be applied across terminals of non-volatile memory element 310 by closing FET M10 acting as a conducting element to connect a second terminal of non-volatile memory element 310 to a reference node 304. In this context, a "conducting element" comprises a circuit element capable of permitting current to pass between two nodes. In a particular implementation, a conducting element may vary a current permitted to pass between nodes based, at least in part, on a particular condition. The particular implementations described herein employ FETs as conducting elements to permit current to pass between source and drain terminals based, at least in part, on a voltage applied to a gate terminal. It should be understood, however, that these are merely examples of conducting elements in the description and drawings provided for illustration, and that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

In this context, a "bitline" comprises a conductor that is connectable to at least one terminal of a memory element during a write operation to transmit a signal altering a memory state of the memory element, or during a read operation to transmit a signal indicative of a current memory state of the memory element. Also, in this context, a "reference node" comprises a node in a circuit that is maintained at a particular voltage level or at a particular voltage difference from another node in the circuit. In one example, a reference node may comprise or be connected to a ground node (e.g., at 0.0V relative to a voltage supply signal). In other particular implementations, a reference node may be maintained at a particular voltage relative to that of a ground node. In this context, a "voltage supply" means a circuit element that generates a voltage level at one or more nodes relative to one or more reference nodes. In one implementation, a voltage supply may comprise a circuit to generate a voltage supply signal having a predetermined voltage level. It should be understood, however, that this is merely an example of a voltage supply, and claimed subject matter is not limited in this respect. In this context, a "common source voltage" means one or more nodes maintained at a particular voltage level. In one particular implementation, a common source voltage may comprise a voltage maintained at one or more reference nodes such as a ground node or a node at 0.0V relative to a voltage maintained by a voltage supply. It should be understood, however, that this is merely an example of a common source voltage, and claimed subject matter is not limited in this respect.

According to an embodiment, voltage supply signal VDDSOC may be applied to periphery circuitry 312 at a power-up event as signal PRDY is driven low to close PFET M4. In a particular implementation, signals VDDSOC and PRDY may be supplied to integrated circuit device 212 at external terminals or signal pins. This event may occur at a time $t_0$ in the timing diagram of FIG. 4. Here a voltage of signal nWL is driven high at a gate terminal of inverter 302 at a time $t_1$, which in turn drives a voltage of signal on wordline WL low at time $t_2$. Here, while signal PRDY is maintained low and signal nWL is maintained high, the voltage of signal nWL may remain high at the gate terminal of inverter 302 and a voltage signal on wordline WL may remain low, thereby clamping the voltage signal on wordline WL to a low voltage such that FET M10 remains open. While FET M6 remains in an open state and inverter 302 is not connected to VDDPE, inverter 302 may nevertheless respond to a raised voltage on nWL by clamping WL at an output terminal of inverter 302 to a low voltage. In this context, "clamping" a signal as referred to herein means maintaining a signal at a node, terminal, conductor, etc. to a particular voltage for a particular duration or under particular conditions. Here, by maintaining FET M10 in an open state, non-volatile memory element 310 may be isolated by disconnecting one of its terminals. It should be understood, however, that this is merely an example of how a non-volatile memory element may be isolated, and claimed subject matter is not limited in this respect. Also, in this context, "unclamping" a signal as referred to herein means allowing a signal at a node, terminal, conductor, etc. currently clamped maintained at a particular voltage to deviate or change from the particular voltage.

While the voltage signal on wordline WL is clamped to a low voltage, voltage source signals including signals VDVPE, VDDSET and VDDRST may be powered up. Since the voltage signal on wordline WL is clamped low while voltage source signals including signals VDDSET, VDDRST and VDDPE are being powered up, FET M10 is maintained open so as to isolate non-volatile memory element 310 from any transients that may occur from powering up voltage sources including signals VDDSET and VDDRST.

Figure 4:
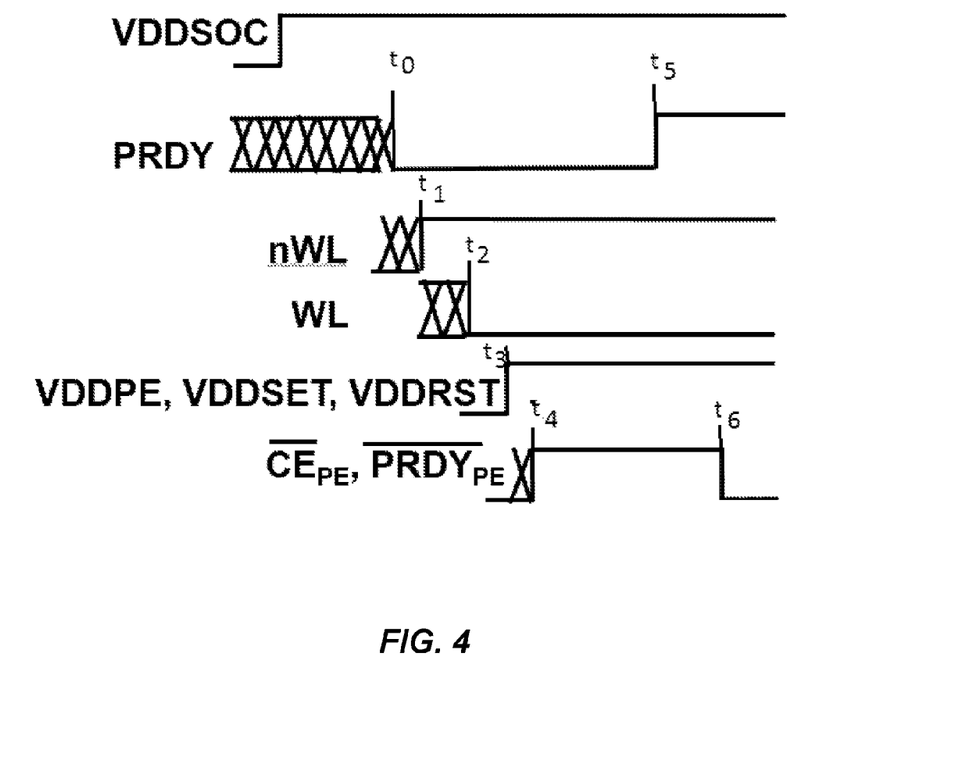
FIG. 4 is timing diagram illustrating a sequence for powering up a device according to an embodiment.

According to an embodiment, voltage source VDDPE may provide power to internal level-shifters and internal inverters including level shifters and inverters of periphery circuitry 312 and inverter 302. Following commencement of powering up voltage source signals VDDSET, VDDRST and VDDPE at time $t_3$, and while the voltage signal on wordline WL is still clamped low, signals $\overline{PRDY}_{PE}$ and $\overline{CE}_{PE}$ may be maintained high so that voltage source signal VDDPE is disconnected from shifters and inverters of periphery circuitry 312 and inverter 302. PRDY may then be raised at time $t_5$ to unclamp the voltage signal on wordline WL. Between times $t_0$ and $t_3$, a power signal from VDDPE is not available, and therefore no provided to peripheral circuitry 312 and inverter 302. A power signal from VDDPE becomes available at time $t_3$ and is provided to peripheral circuitry 312 through FET M2 at time $t_3$. A power signal from VDDPE is then provided to inverter 302 at time $t_6$ through FET M6. As pointed out above, inverter may clamp a voltage at WL low prior to receiving a power signal from VDDPE from $t_2$ to $t_6$ responsive to a raised voltage on nWL.

According to an embodiment, integrated circuit 212 may comprise one or more external terminals or signal pins to receive power signals (e.g., voltage source signal VDDSOC) for powering devices of integrated circuit 212 and control signals (e.g., CE, PRDY, $\overline{PRDY}_{PE}$ and $\overline{CE}_{PE}$). According to an embodiment, control signals provided to the one or more external terminals or signal pins may be determined or controlled by firmware executed by a processor or microcontroller (e.g., in periphery 202, not shown).

In particular embodiments, such as those previously described herein, plurality of CEM devices may be formed to bring about integrated circuit devices, which may include, for example, a first correlated electron device having a first CEM and a second correlated electron device having a second correlated electron material, wherein the first and second CEMs may comprise substantially dissimilar impedance characteristics. Also, in an embodiment, a first CEM device and a second CEM device, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a CEM. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment. In a further embodiment, CEM devices may be formed in devices in combination with conducting elements as described herein formed by the same or different processes. In an example implementation, CEM devices may be formed in combination with conducting elements using a different and/or complementary process technologies such as complementary metal oxide semiconductor (CMOS) technologies.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

The claims are as follows:

1. A method comprising:
    clamping a signal of a wordline to a particular voltage so as to isolate at least one non-volatile memory element of an array of non-volatile memory elements of an integrated device in response to a start of a power up procedure for the integrated device, the integrated device comprising a peripheral device including a memory controller capable of accessing the at least one non-volatile memory element at least in part by generating the signal of the wordline, the power up procedure comprising applying an external power source signal to the integrated device followed by powering one or more first voltage sources to generate one or more programming signals for a write operation on the at least one non-volatile memory element and one or more second voltage sources for powering the peripheral device, the at least one non-volatile memory element being isolated from the one or more first voltage sources and the one or more second voltage sources so as to protect a current memory state of the at least one non-volatile memory element during the power up procedure;
    powering the one or more first voltage sources and the one or more second voltage sources; and
    unclamping the signal of the wordline following the powering of the one or more first voltages sources and the one or more second voltage sources.

2. The method of claim 1, and further comprising disconnecting a terminal of the at least one non-volatile memory element in response to the particular voltage.

3. The method of claim 1, and further comprising starting the power up procedure by applying a power signal to a first external terminal of the integrated device.

4. The method of claim 3, wherein clamping the signal of the wordline to the particular voltage further comprises applying a control signal to a second external terminal of the integrated device.

5. The method of claim 4, wherein:
    clamping the signal of the wordline comprises clamping the signal of the wordline following application of the external power source signal to the integrated device;
    unclamping the signal of the wordline following the power up procedure comprises unclamping the wordline in response to a change in a voltage on the second external terminal.

6. The method of claim 1, wherein the power up procedure comprises powering a plurality of voltage sources including at least a first voltage source to generate a first programming signal for a set operation and a second voltage source to generate a second programming signal for a reset operation.

7. The method of claim 1, wherein the at least one non-volatile memory element comprises a correlated electron switch (CES).

8. The method of claim 1, wherein the at least one non-volatile memory element comprises a correlated electron random access memory (CeRAM) element.

9. The method of claim 1, wherein the current memory state comprises a current impedance state, and wherein the at least one non-volatile memory element is isolated from the at least one of the one or more voltage sources during the power-up procedure so as to prevent an unintended set or reset operation on the at least one non-volatile memory element.

10. A device comprising:
an array of non-volatile memory elements;
a peripheral device comprising a memory controller capable of accessing at least one non-volatile memory element of the array of non-volatile memory elements at least in part by generation of a signal on a wordline; and
circuitry to generate, following application of an external power source signal to the device, one or more first voltage sources for a programming signal on at least one bitline for write operations on at least one non-volatile memory element in the array of non-volatile memory elements and generate one or more second voltage sources for powering the peripheral device, wherein the peripheral device further comprises:
a circuit to clamp the wordline voltage to a particular voltage during a power-up procedure until the one or more first voltage sources and one or more second voltage sources are powered, wherein responsive to the wordline voltage being clamped to the particular voltage during the power-up procedure the at least one non-volatile memory element is isolated from at least a portion of the circuitry to generate one or more voltage sources for the programming signal so as to protect a current memory state of the at least one non-volatile memory element during the power up procedure.

11. The device of claim 10, wherein the at least one non-volatile memory element comprises a correlated electron switch (CES) element.

12. The device of claim 11, wherein the one or more voltage source are capable of generating a first programming signal for placing the CES in a low impedance or conductive state, and a second programming signal for placing the CES in a high impedance or conductive state.

13. The device of claim 10, and further comprising a conducting element coupled to the wordline to apply the programming signal to the at least one non-volatile memory element while the conducting element is in a closed state, and wherein the conducting element is configured to be maintained in an open state to disconnect the at least one terminal of the at least one non-volatile memory elements while the wordline voltage is clamped.

14. The device of claim 10, and further comprising at least a first external terminal to receive the external power source signal.

15. The device of claim 14, and further comprising at least a second external terminal to receive a control signal, and wherein the circuit to clamp the wordline voltage during the power-up procedure is responsive to the control signal to clamp the wordline signal to the particular voltage following application of the external power source signal.

16. The device of claim 15, wherein the circuit to clamp the wordline voltage during the power-up procedure is further responsive to a change in a voltage of the control signal to unclamp the wordline following the power up procedure.

17. The device of claim 15, and wherein the device comprises an integrated device further comprising one or more processors, core logic or core circuitry, or a combination thereof.

18. The device of claim 10, wherein the current memory state comprises a current impedance state, and wherein the at least one non-volatile memory element is isolated from the at least one of the one or more voltage sources during the power-up procedure so as to prevent an unintended set or reset operation on the at least one non-volatile memory element.

* * * * *